(12) United States Patent
Cho et al.

(10) Patent No.: US 6,472,273 B2
(45) Date of Patent: Oct. 29, 2002

(54) METHOD OF MANUFACTURING A FLASH MEMORY DEVICE

(75) Inventors: Byung Hee Cho, Kyungki-do (KR); Noh Yeal Kwak, Kyungki-do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/875,734

(22) Filed: Jun. 6, 2001

(65) Prior Publication Data

US 2002/0009853 A1 Jan. 24, 2002

(30) Foreign Application Priority Data

Jun. 30, 2000 (KR) .............................................. 00-37002

(51) Int. Cl.[7] .............................................. H01L 21/336
(52) U.S. Cl. ........................ 438/264; 438/257; 438/261; 438/591; 438/593
(58) Field of Search ................................. 438/257, 261, 438/264, 197, 585, 591, 592, 593, 594

(56) References Cited

U.S. PATENT DOCUMENTS

| | | | | |
|---|---|---|---|---|
| 6,096,603 A | * | 8/2000 | Chang et al. | 438/258 |
| 6,133,096 A | * | 10/2000 | Su et al. | 438/257 |
| 6,329,247 B1 | * | 12/2001 | Ito | 257/315 |

* cited by examiner

Primary Examiner—Eddie Lee
Assistant Examiner—N. Drew Richards
(74) Attorney, Agent, or Firm—Marshall, Gerstein & Borun

(57) ABSTRACT

A method of manufacturing a flash memory device includes the steps of sequentially forming a tunnel oxide film and a first polysilicon layer on a semiconductor substrate in which a device separation film is formed and then patterning the tunnel oxide film and the first polysilicon layer to form a floating gate; forming a mask so that a portion in which a source region will be formed can be exposed and then removing the device separation film at the exposed portion; forming a dielectric film including a lower oxide film, a nitride film, and an upper oxide film on the entire structure; performing an annealing process; then forming a second polysilicon layer on the dielectric film; sequentially removing the polysilicon layer, the upper oxide film, and the nitride film in a portion in which a source region and a drain region will be formed, and injecting impurity ions into the semiconductor substrate at a portion in which the lower oxide film remains to form a source region and a drain region; after removing the remaining lower oxide film, sequentially forming a third polysilicon layer and a tungsten silicide layer on the entire structure and then patterning the third polysilicon layer and the tungsten silicide layer to form a control gate; and performing an annealing process for activating the impurity ions injected into the source region and the drain region.

10 Claims, 9 Drawing Sheets

METHOD OF MANUFACTURING A FLASH MEMORY DEVICE

BACKGROUND OF THE INVENTION

1. Field of the Invention

The invention relates generally to a method of manufacturing a flash memory device. More particularly, the invention relates to a method of manufacturing a flash memory device, which can prevent damage of a semiconductor substrate during an ion injection process for forming a junction region.

2. Description of the Prior Art

Generally, a flash memory cell includes a floating gate formed on and electrically separated from the semiconductor substrate, a control gate electrically formed on the floating gate and also separated from the floating gate by a dielectric film, and a junction region formed on the semiconductor substrate at both sides of the floating gate. A method of manufacturing a flash memory device having this memory cell will be explained.

FIGS. 1A–1E are cross-sectional views of a device for explaining a method of manufacturing a conventional flash memory device, which will be explained by reference to FIGS. 2A–2D.

FIG. 1A is a cross-sectional view of a device in which a device separation film 2 is formed in a field region of a semiconductor substrate 1, and FIG. 2A shows a layout of FIG. 1A.

FIG. 1B shows a cross-sectional view of the device. After a tunnel oxide film 3 and a first polysilicon layer are sequentially formed on the entire structure, they are patterned to form a floating gate 4. The floating gate 4 is patterned in the Y direction, as shown in FIG. 2B.

Referring to FIG. 1C, after a dielectric film 5 is formed on the entire structure and is then cured by an annealing process, a second polysilicon layer 6a, a tungsten silicide layer 6b, and a reflection prevention film 6c are sequentially formed on the dielectric film 5. Then, the reflection prevention film 6c, the tungsten silicide layer 6b, the second polysilicon layer 6a, and the dielectric film 5 are sequentially patterned to form a control gate including the second polysilicon layer 6a and the tungsten silicide layer 6b. The control gate is patterned in the X direction.

FIG. 1D is a cross-sectional view of the device in which a first mask 7 is formed so that the semiconductor substrate 1 in the portion in which a source region will be formed can be exposed, the device separation film 2 in the exposed portion (section B in FIG. 2C) is removed and impurity ions are then injected into the exposed portion of the semiconductor substrate 1, thus forming a source region 8, which shows a cross-sectional view of the device taken along lines A1–A2 in FIG. 2C. At this time, the source region 8 forms a line shape extending in the X direction, as shown in FIG. 2C.

FIG. 1E is a cross-sectional view of the device in which, after the first mask 7 is removed, a second mask 9 is formed so that the semiconductor substrate 1 in the portion in which a drain region will be formed and impurity ions are injected into the exposition portion of the semiconductor substrate 1, thus forming a drain region 10, which shows a cross-sectional view of the device taken along lines C1–C2 in FIG. 2D.

Next, after the second mask 9 is formed, an annealing process is performed to the impurity ions injected into the source region 8 and the drain region 10.

In the conventional method, however, as the semiconductor substrate at the portion from which the dielectric film is removed is exposed during a self-alignment etching process for forming the control gate, it tends to damage the semiconductor substrate due to the etching. Further, as the ion injection process for forming the source region and the drain region is performed with the damaged semiconductor substrate being exposed, dopants are damaged and the injected ions become non-uniformly distributed.

Therefore, the threshold voltage (Vth) of the memory cell varies due to damage of the dopants and non-uniformity of the concentration and the operating speed of the device is lowered, thus resulting in degrading reliability of the device.

SUMMARY OF THE INVENTION

A method of manufacturing a flash memory device includes the steps of sequentially forming a tunnel oxide film and a first polysilicon layer on a semiconductor substrate in which a device separation film is formed and then patterning the tunnel oxide film and the first polysilicon layer to form a floating gate; forming a mask so that a portion in which a source region will be formed can be exposed and then removing the device separation film at the exposed position; forming a dielectric film including a lower oxide film, a nitride film and an upper oxide film on the entire structure, performing an annealing process, and then forming a second polysilicon layer on the dielectric film; sequentially removing the polysilicon layer, the upper oxide film and the nitride film in a portion in which a source region and a drain region will be formed, and injecting impurity ions into the semiconductor substrate at a portion in which the lower oxide film remains to form a source region and a drain region; after removing the remained lower oxide film, sequentially forming a third polysilicon layer and a tungsten silicide layer on the entire structure and then patterning the third polysilicon layer and the tungsten suicide layer to form a control gate; and performing an annealing process for activating the impurity ions injected into the source region and the drain region.

The device separation film is removed preferably by a wet etching process using HF solution of a 50:1 concentration. The floating gate is patterned in the X and Y directions so that it can have an independent shape. The dielectric film and the second polysilicon layer are preferably formed by low-pressure chemical vapor deposition method.

Also the upper oxide film and the nitride film are removed by plasma etching process. The lower oxide film remains in an amorphous state. The annealing process is preferably performed by rapid thermal process (RTP) under nitrogen ($N_2$) atmosphere.

BRIEF DESCRIPTION OF THE DRAWINGS

The aforementioned aspects and other features of the present invention will be explained in the following description, wherein.

DETAILED DESCRIPTION OF PREFERRED EMBODIMENTS

It is an objective of the disclosure to provide a method of manufacturing a flash memory device, by which an underlying oxide film of a dielectric film at a portion in which source and drain regions will be formed remains amorphous, so that damage of a semiconductor substrate can be prevented during ion injection process for forming the source region and the drain region.

The method will be described in detail by way of a preferred embodiment with reference to accompanying drawings.

FIGS. 3A–3F are cross-sectional views of a device for explaining a method of manufacturing a flash memory device according to the disclosed method, which will be explained by reference to FIGS. 4A–4E.

Figure 1A:
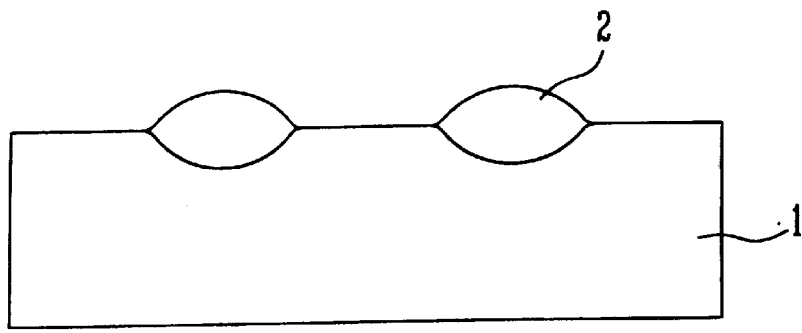
FIGS. 1A–1E are cross-sectional views of a device for explaining a method of manufacturing a conventional flash memory device.
Figure 1B:
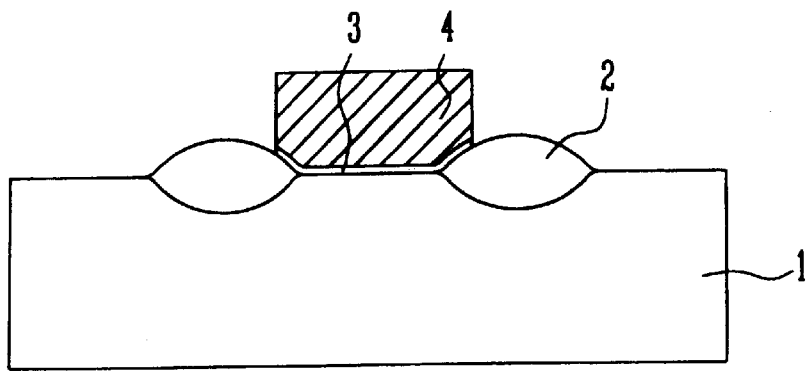
Figure 1C:
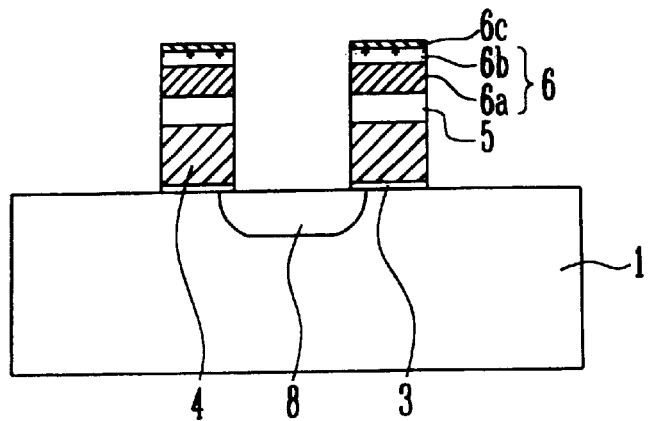
Figure 1D:
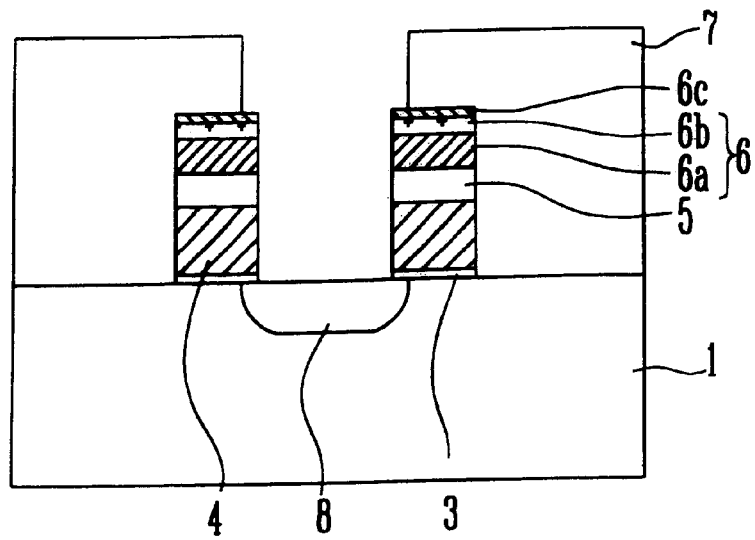
Figure 1E:
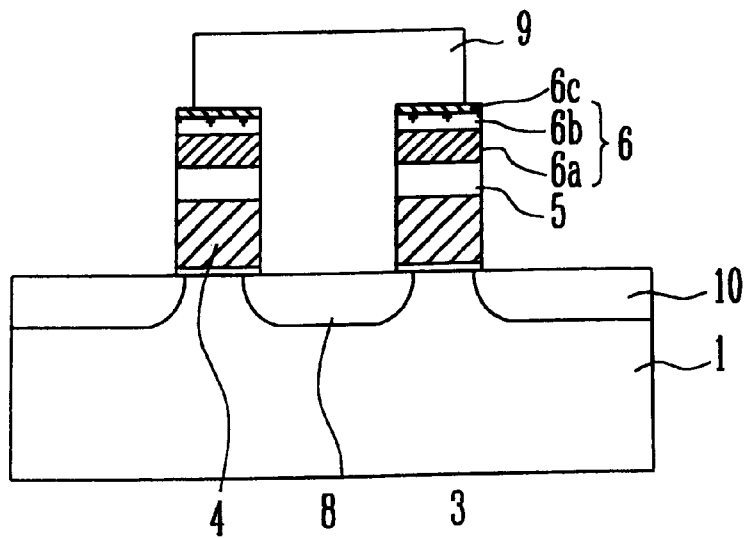
Figure 2A:
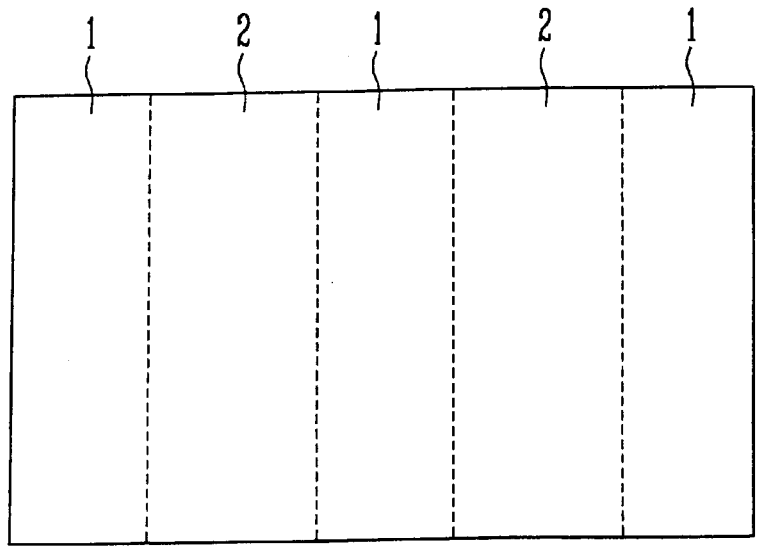
FIGS. 2A–2D show layouts for explaining a method of manufacturing a conventional flash memory device.
Figure 2B:
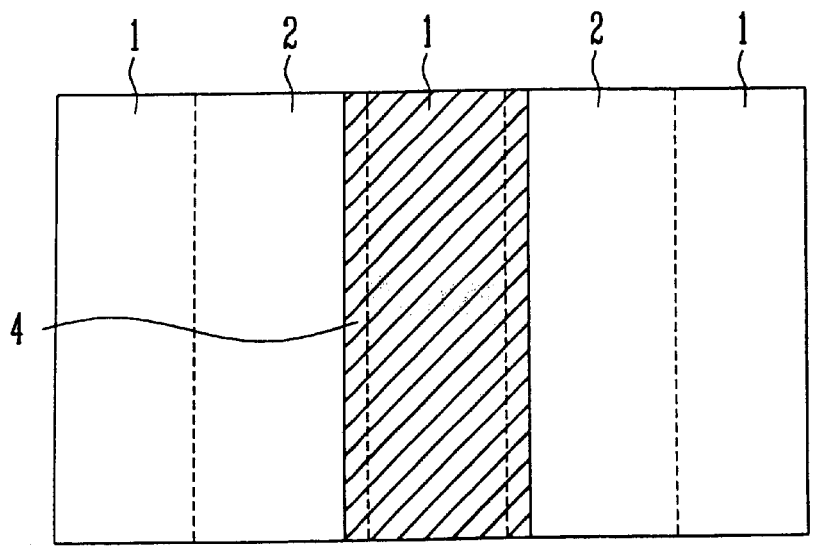
Figure 2C:
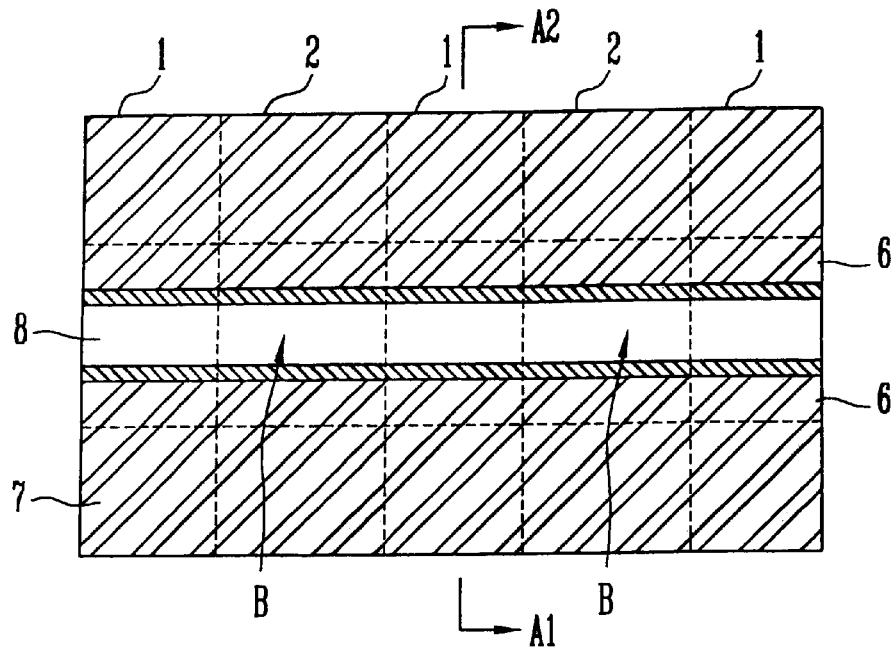
Figure 2D:
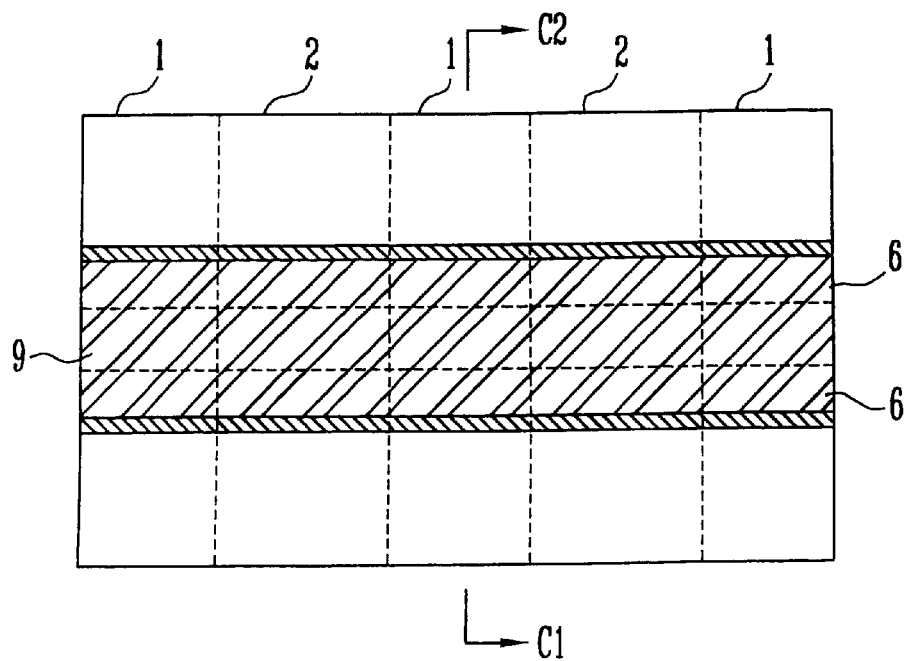
Figure 3A:
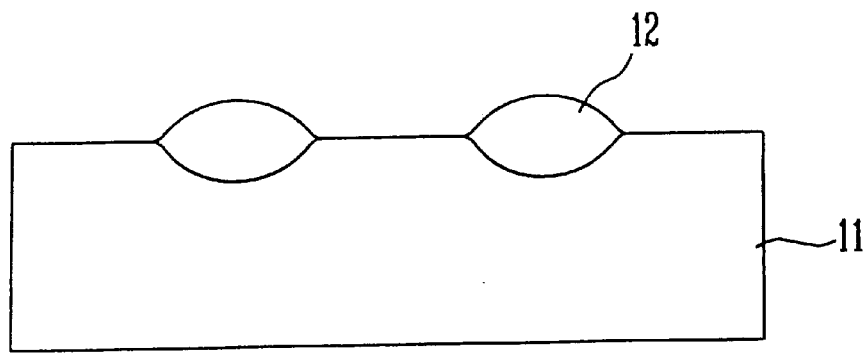
FIGS. 3A–3F are cross-sectional views of a device for explaining a method of manufacturing a flash memory device according to the disclosure.
Figure 4A:
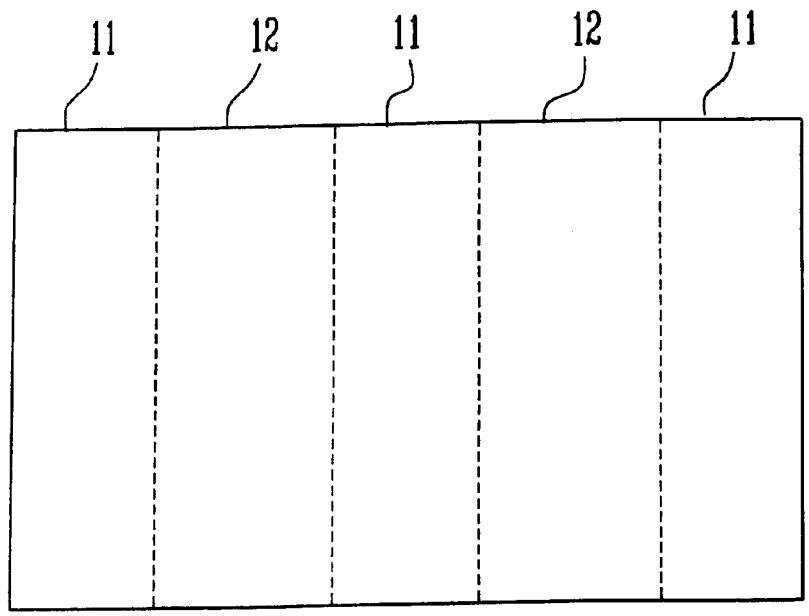
FIGS. 4A–4E show layouts for explaining a method of manufacturing a flash memory device according to the disclosure.

FIG. 3A is cross-sectional view of a device in which a device separation film 12 is formed in the field region of a semiconductor substrate 11, and FIG. 4A shows a layout of FIG. 3A.

Figure 3B:
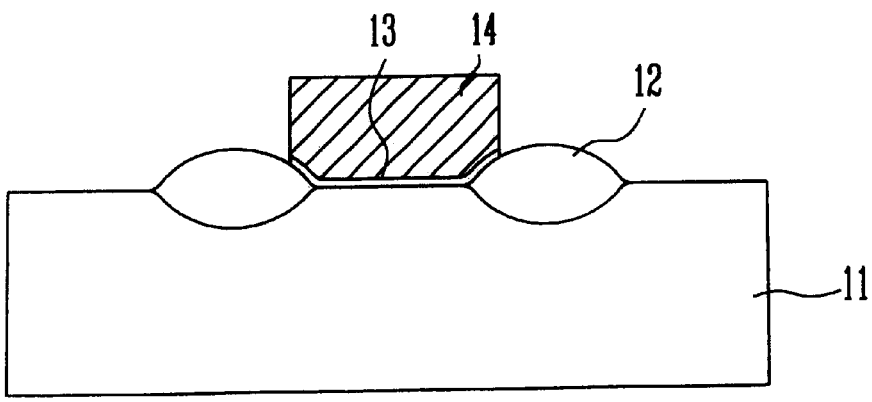
Figure 4B:
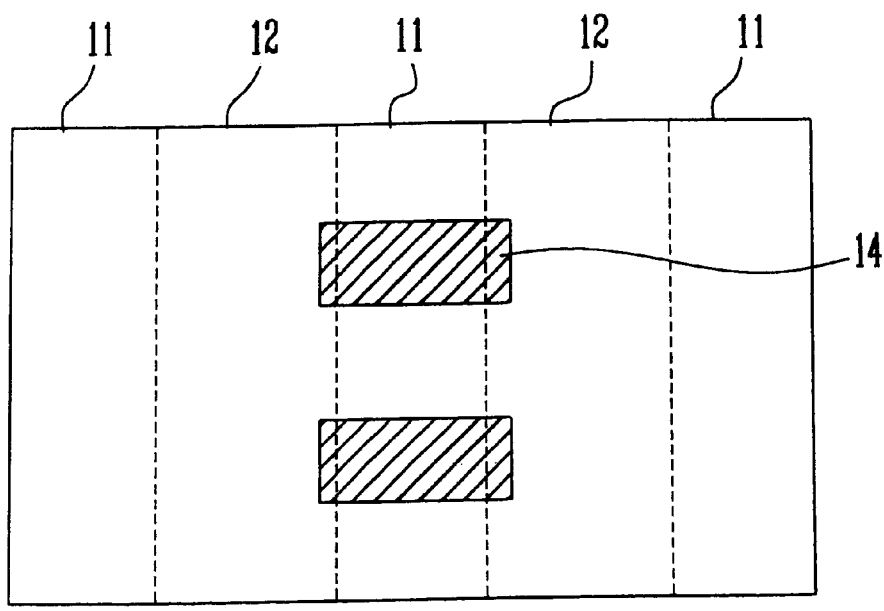

FIG. 3B shows a cross-sectional view of the device in which after a tunnel oxide film 13 and a first polysilicon layer are sequentially formed on the entire structure, they are patterned to form a floating gate 14. The floating gate 14 is patterned in the X and Y directions, so that it can have an independent shape, as shown in FIG. 4B.

Figure 3C:
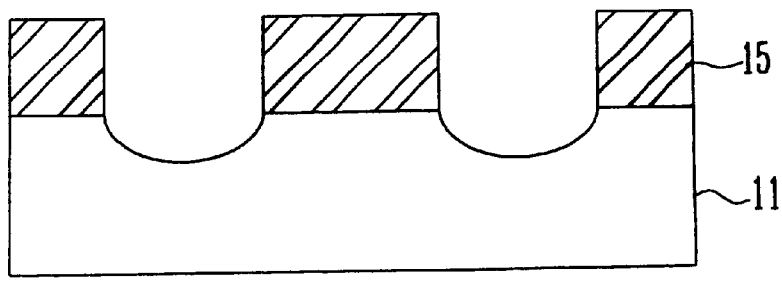
Figure 4C:
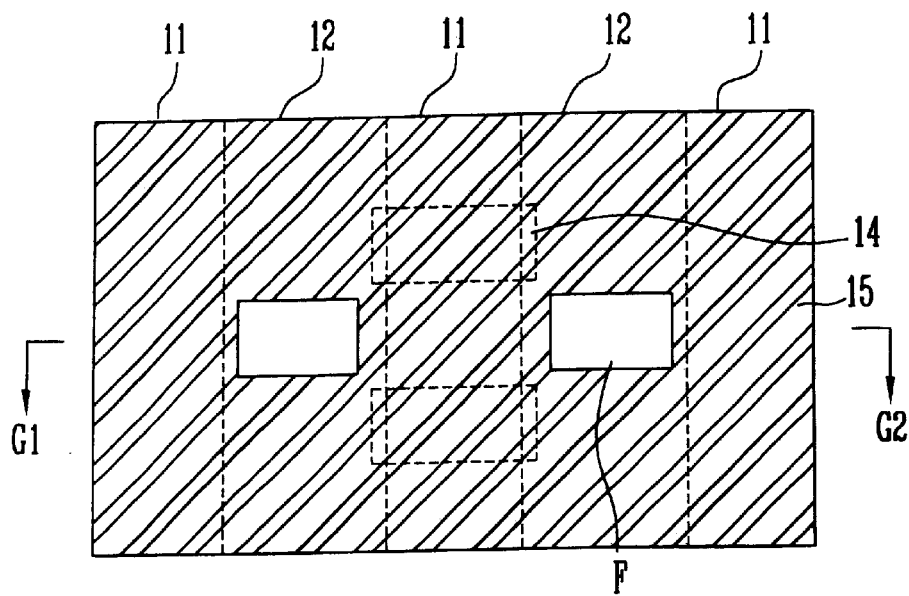

FIG. 3C shows a cross-sectional view of the device in which a mask 15 is formed so that the portion in which a source region will be formed can be exposed, and the device separation film 12 at the exposed position (section F in FIG. 4C) is then removed by wet etching process using HF solution of 50:1 concentration, which shows a cross-sectional view of the device taken along lines G1–G2 in FIG. 4C.

Figure 3D:
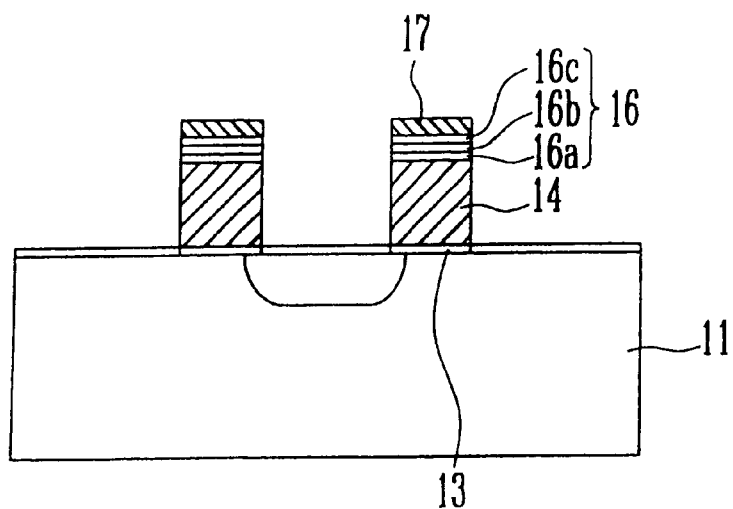
Figure 4D:
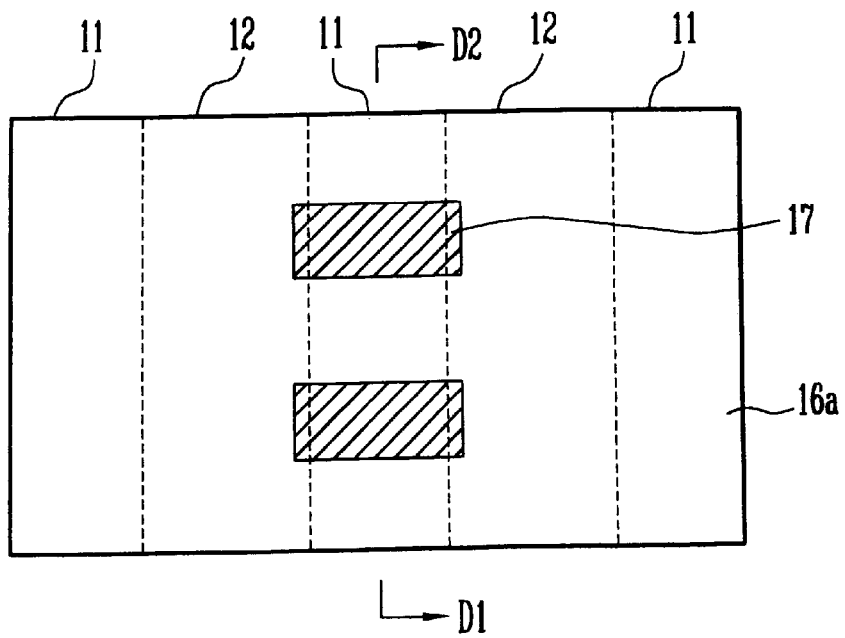
Figure 4E:
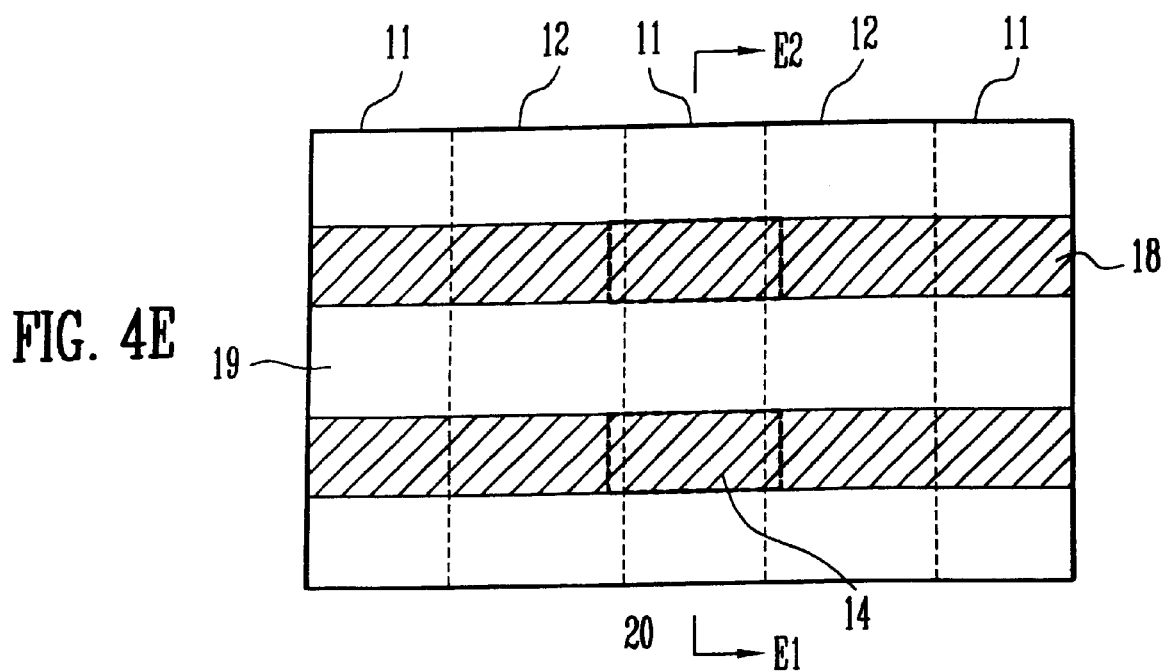

Referring to FIG. 3D, after a dielectric film 16 including a lower oxide film 16a, a nitride film 16b, and an upper oxide film 16c is formed on the entire structure and is then cured by an annealing process, a second polysilicon layer is formed on the dielectric film 17. Then, the polysilicon layer 17, the upper oxide film 16c and the nitride film 16b in the portion in which a source region and a drain region will be formed, are sequentially removed. As shown in FIG. 4D, the dielectric film 16 and the second polysilicon layer 17 remain on the floating gate 14 and only the lower oxide film 16a remains on the other regions. At this time, the remaining lower oxide film 16a is subjected to damage by plasma when a plasma etching process for removing the nitride film 16b, so that the crystal state of the lower oxide film 16a is changed into an amorphous state. FIG. 3D shows a cross-sectional view of the device taken along lines D1–D2 in FIG. 4D.

At this time, the dielectric film 16 and the second polysilicon layer 17 are formed preferably by low-pressure chemical vapor deposition (LPCVD) method.

Figure 3E:
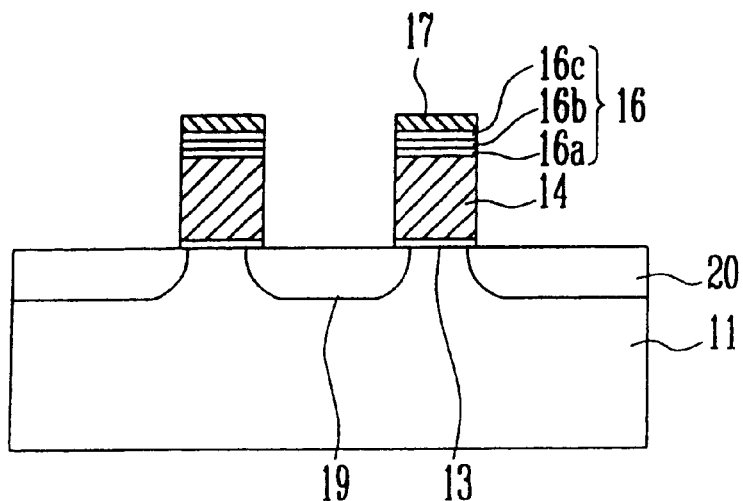

FIG. 3E is a cross-sectional view of the device in which impurity ions such as arsenic (As) or phosphorous (P) are injected into the portion of the semiconductor substrate 11 in which the lower oxide film 16a remains to thus form a source region 19 and a drain region 20, and the remaining lower oxide film 16a is removed. The ion injection process is performed under the condition that the ion injection energy is in the range of about 30 KeV to about 100 KeV and the amount of ion injection is in the range of about $1E15$ ions/cm$^2$ to about $5E15$ ions/cm$^2$, so that ions can be injected into the depth direction to the semiconductor substrate.

Figure 3F:
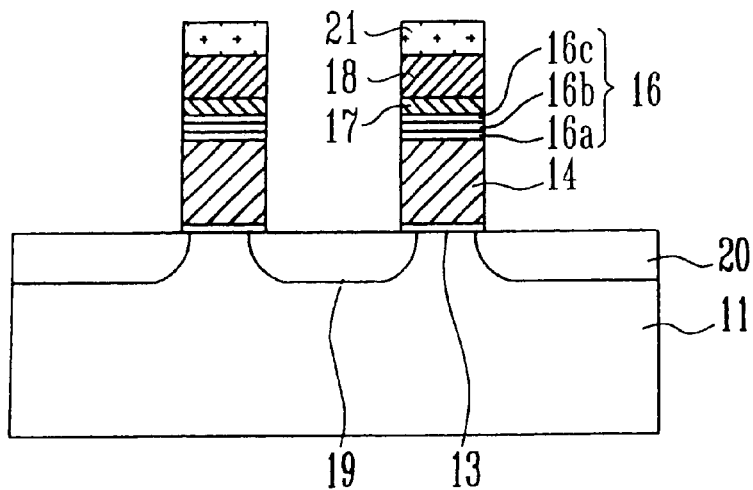

FIG. 3F is a cross-sectional view of the device in which a third polysilicon layer 18, a tungsten silicide layer 21, and a reflection prevention film (not shown) are sequentially formed, and the reflection prevention film, the tungsten silicide layer 21 and the third polysilicon layer 18 are sequentially patterned. On the dielectric film 16 is formed a control gate, which includes the second and third polysilicon layers 17 and 18 and the tungsten silicide layer 21. FIG. 3F shows a cross-sectional view of the device taken along lines E1–E2 in FIG. 4E. At this time, the control gate is formed in the X direction.

Next, the impurity ions injected into the source region 19 and the drain region 20 are activated. In order to recrystallize the amorphous portion by the ion injection, an annealing process is performed under nitrogen (N$_2$) atmosphere. At this time, in order to prevent oxidization of the source and drain regions 19 and 20, a rapid thermal process (RTP) is performed for about 5 seconds to about 30 seconds, while the temperature is continuously increased up to about 900° C. to about 1000° C. at a rate of 50° C./sec.

As mentioned above, the method can prevent damage of dopants due to damage of a semiconductor substrate and can uniformly distribute injected ions, by maintaining the amorphous structure of an underlying oxide film of a dielectric film at a portion in which source and drain regions will be formed and by preventing damage of a semiconductor substrate during ion injection for forming the source region and the drain region. Also, the method can form an effective junction region since gathering of the dopants can be formed between a semiconductor substrate and a lower oxide film.

Therefore, the method can stably maintain the threshold voltage and operating speed of a memory cell since ions are injected without damage of the semiconductor substrate. Also, the method can maximize an ion injection effect since ions are injected at a low energy and projected range (RP). In addition, the method can shorten the annealing time and can recover damage by the ion injection, since the annealing process for activating ions is performed after the source and drain regions are formed.

Further, the method can improve throughput by reducing the number of defective cells generated in the course of a subsequent test.

The method has been described with reference to a particular embodiment in connection with a particular application. Those having ordinary skill in the art and access to the teachings of the method will recognize additional modifications and applications within the scope thereof.

It is therefore intended by the appended claims to cover any and all such applications, modifications, and embodiments within the scope of the invention.

What is claimed is:

1. A method of manufacturing a flash memory device, comprising the steps of:

providing a semiconductor substrate in which a device separation film is formed;

forming a tunnel oxide film and a first polysilicon layer on said semiconductor device;

subsequently patterning said tunnel oxide film and said first polysilicon layer to form a floating gate;

forming a mask to expose a portion in which a source region will be formed;

removing said device separation film at the exposed portion;

forming a dielectric film comprising a lower oxide film, a nitride film and an upper oxide film on the entire structure, performing an annealing process, and then forming a second polysilicon layer on said dielectric film;

sequentially removing said polysilicon layer, said upper oxide film, and said nitride film in a portion in which said source region and a drain region will be formed, and injecting impurity ions into said semiconductor substrate at a portion in which said lower oxide film remains to form said source region and said drain region;

after removing said remaining lower oxide film, sequentially forming a third polysilicon layer and a tungsten silicide layer on the entire structure and then patterning said third polysilicon layer and said tungsten suicide layer to form a control gate; and performing an annealing process for activating the impurity ions injected into said source region and said drain region.

2. The method of claim 1, comprising the step of patterning said floating gate in X and Y directions so that the gate can have an independent shape.

3. The method of claim 1, comprising carrying out said step of removing said device separation film by a wet etching process using a HF solution of 50:1 concentration.

4. The method of claim 1, comprising carry out said step of forming said dielectric film and said second polysilicon layer by a low pressure chemical vapor deposition method.

5. The method of claim 1, comprising carry out said step of removing said upper oxide film and said nitride film by a plasma etching process.

6. The method of claim 1, wherein said remaining lower oxide film is amorphous.

7. The method of claim 1, comprising the step of injecting said impurity ions with an ion injection energy of about 30 KeV to about 100 KeV in an amount of about 1E15 ions/cm$^2$ to about 5E15 ions/cm$^2$.

8. The method of claim 1, wherein said impurity ions are selected from arsenide and phosphorous.

9. The method of claim 1, comprising carry out said step of performing said annealing process by a rapid thermal process under nitrogen atmosphere.

10. The method of claim 9, comprising carry out said step of performing said rapid thermal process for about 5 seconds to about 30 seconds, while continuously increasing the temperature up to about 900° C. to about 1000° C. at a rate of 50° C./sec.

* * * * *